United States Patent [19]
Yoshida

[11] Patent Number: 5,541,596
[45] Date of Patent: Jul. 30, 1996

[54] SERIAL/PARALLEL CONVERTER CIRCUIT WITH UNCERTAINTY REMOVING FUNCTION

[75] Inventor: Shoji Yoshida, Kawasaki, Japan

[73] Assignee: Fujitsu Limited, Kawasaki, Japan

[21] Appl. No.: 186,333

[22] Filed: Jan. 25, 1994

[30] Foreign Application Priority Data

May 21, 1993 [JP] Japan .................................. 5-119759

[51] Int. Cl.$^6$ ........................................... H03M 9/00
[52] U.S. Cl. ............................ 341/100; 341/94; 341/101
[58] Field of Search .......................... 341/94, 100, 101, 341/118

[56] References Cited

U.S. PATENT DOCUMENTS

| | | | |
|---|---|---|---|
| 4,387,366 | 6/1983 | Chow | 341/100 |
| 4,918,446 | 4/1990 | Yagi | 341/94 |
| 5,030,951 | 7/1991 | Eda et al. | 341/100 |

*Primary Examiner*—Marc S. Hoff

*Attorney, Agent, or Firm*—Armstrong, Westerman, Hattori, McLeland & Naughton

[57] ABSTRACT

The present invention relates to a serial/parallel converter circuit with uncertainty removing function. The object of the invention is to offer that signals can be instantaneously rearranged in the same data arrangement as that of original parallel signals prior to a parallel to serial conversion. The serial/parallel converter circuit is constituted of a serial/parallel converter unit for converting a serial signal once subjected to a parallel to serial conversion into parallel signals; a parallel/serial converter unit for converting the parallel signals converted by the serial/parallel converter unit into a serial signal; a comparing and judging unit for judging whether the serial/parallel converter unit has converted at a predetermined timing operation, by comparing the serial signal from the parallel/serial converter unit with the serial signal inputted to the serial/parallel converter unit; and correcting unit for correcting the parallel signals from the serial/parallel converter unit when the serial/parallel converter unit has not converted at a predetermined timing operation, based on the result from the comparing and judging unit.

12 Claims, 12 Drawing Sheets

FIG. 8
S40 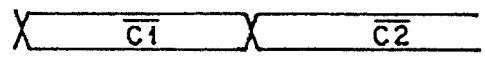
S41 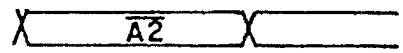
S42 
S43 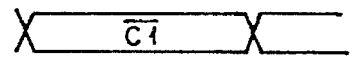
S44 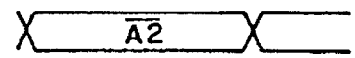
S45 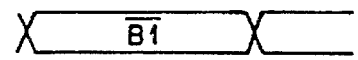

SERIAL/PARALLEL CONVERTER CIRCUIT WITH UNCERTAINTY REMOVING FUNCTION

BACKGROUND OF THE INVENTION

1) Field of the Invention

The present invention relates to a serial/parallel converter circuit with an uncertainty removing function suitably used in a communications system where a cable transmission line coexists with a radio transmission line or a communications system where plural cable transmission lines are networked.

2) Description of the Related Art

It has been often been arranged that communications between plural cable sections are relayed, for example, via a radio communication section. In the radio communication section, information from the cable transmission path is subjected to a signal conversion based on a predetermined modulation/demodulation system to transmit and receive.

In the radio transmission, the number of the transmission paths is dependent on the modulation/demodulation system used. The 16QAM (quadrature amplitude modulation) system, for example, allows communications via only four transmission paths.

In the above communications system, signals from 8 cable transmission paths, for example, are subjected to a parallel/serial conversion to multiplex, thus transmitting via 4 transmission paths across the radio communication section.

On the receiving side, the signals from the 4 transmission paths are subjected to a serial/parallel conversion to separate them so that the demultiplexed signals can be again transmitted through 8 cable transmission paths.

Thus the communications between the cable communication section and the radio communication section can be performed by using a serial/parallel converter circuit or a parallel/serial converter circuit.

In the 8 cable transmission paths as described above, when the radio communication section is a relay section employing a 16QAM modulation/demodulation system, 4 serial/parallel converter circuits, each which converts two parallel data into one serial datum, are arranged at the boundary portion where signals from the cable communication section are transmitted to the radio communication section, while 4 serial/parallel converter circuits, each which converts one serial datum into two parallel data, are arranged at the boundary portion where signals from the radio communication section are transmitted to the cable communication section.

A prior art serial/parallel converter circuit divides serially chained clocks by 2 to form clock chains in parallel, thus converting serial data into parallel data.

However, as described above, when a serial signal once converted by the parallel/serial converter circuit is converted again into parallel signals, the prior art serial/parallel converter circuit may cause two kinds of bit arrangements for parallel data because the starting point in the serial data is unclear at the clock frequency dividing timing for a parallel conversion.

For that reason, transmitting signals in the radio section may cause a difference in data arrangement (an uncertainty of a data arrangement) between data on the transmitting side and data on the receiving side.

In order to judge whether the data arrangement is correct, it may be considered to use a frame synchronizing method where signal bits are rearranged when a frame is out of synchronization in a fixed period of time or a data disarrangement occurs. However, there is a disadvantage in that this method takes much time to rearrange signal bits and cannot cope with an erroneous synchronization due to poor line quality, thus making suitable communications difficult.

SUMMARY OF THE INVENTION

The present invention is made to overcome the above mentioned problems. An object of the present invention is to provide a serial/parallel converter circuit with an uncertainty removing function that can instantaneously rearrange signals in the same data arrangement as that of the corresponding signals in parallel prior to a parallel to serial conversion.

In order to achieve the above objects, according to claim 1, the serial/parallel converter unit with an uncertainty removing function of the present invention is characterized by a serial/parallel converter unit for converting a serial signal once subjected to a parallel to serial conversion into parallel signals; a parallel/serial converter unit for converting parallel signals once converted by the serial/parallel converter unit into a serial signal; a comparing and judging unit for judging whether the serial/parallel converter unit has converted at a predetermined timing operation, by comparing the serial signal from the parallel/serial converter unit with the serial signal inputted to the serial/parallel converter unit; and a correcting unit for correcting the parallel signals from the serial/parallel converter unit based on the result compared and judged by the comparing and judging unit when the serial/parallel converter unit has not converted at the predetermined timing operation.

According to another aspect of the present invention, a delay unit is connected to the input of the comparing and judging unit for delaying the serial signal inputted to the serial/parallel converter unit by a predetermined time to adjust a timing at which the serial signal inputted to the serial/parallel converter unit is compared with the serial signal from the parallel/serial converter unit.

Furthermore, the present invention is characterized in that a delay unit is connected to the input of the correcting unit for delaying parallel signals from the serial/parallel converter unit by a predetermined time to adjust a timing at which the parallel signals from the serial/parallel converter unit is corrected.

Further, the present invention is characterized in that a phase adjusting unit is connected to the input of the parallel/serial converter unit for adjusting the phase of each of parallel signals from the serial/parallel converter unit.

Also, the serial/parallel converter circuit with the uncertainty removing function of the present invention is characterized by a first serial/parallel converter unit for converting a serial signal once subjected to a parallel/serial conversion into parallel signals at a first frequency dividing timing; a second serial/parallel converter unit for converting a serial signal once subjected to a parallel/serial conversion into parallel signals at a second frequency dividing timing; a parallel/serial converter unit for converting parallel signals converted by either the first serial/parallel converter unit or the second serial/parallel converter unit into a serial signal; a comparing and judging unit for comparing the serial signal form the parallel/serial converter unit with the serial signal inputted to both the first serial/parallel converter unit and the second serial/parallel converter unit and then for judging whether either the first serial/parallel converter unit or the second serial/parallel converter unit has converted at a predetermined timing; and a selecting unit for selecting parallel signals from the corresponding serial/parallel converter unit when the conversion of either the first serial/ parallel converter unit or the second serial/parallel converter unit has been made at the predetermined timing and for selecting parallel signals from the remaining serial/parallel converter unit when the conversion of either the first serial/ parallel converter unit or the second serial/parallel converter unit or the second serial/parallel converter unit has not been made at the predetermined timing.

Also, the present invention is also characterized in that a delay unit connected to the input of the comparing and judging unit for delaying a serial signal inputted to both the first serial/parallel converter unit and the second serial/ parallel converter unit by a predetermined time to adjust a timing at which the serial signal inputted to both said first serial/parallel converter unit and the second serial/parallel converter unit is compared with a serial signal from the parallel/serial converter unit.

Moreover, the present invention is characterized in that a first delay unit is connected to an input of the selecting unit for delaying each of parallel signals from the first serial/ parallel converter unit by a predetermined time; and in that a second delay unit is connected to an input of the selecting unit for delaying parallel signals from the second serial/ parallel converter unit by a predetermined time.

Further, the present invention is characterized in that a phase adjusting unit is connected to the input of said parallel/serial converter unit for adjusting the phase of each of parallel signals from either the first serial/parallel converter unit or the second serial/parallel converter unit.

Additionally, the present invention is characterized in that a phase adjusting unit is connected to the output of the serial/parallel converter unit for adjusting the phase of each of parallel signals.

Also, the serial/parallel converter circuit with an uncertainty removing function is characterized by a serial/parallel converter unit for converting a serial signal once subjected to a parallel/serial conversion into a parallel signal according to an input clock timing, the serial/parallel converter unit having a clock timing inverter unit for inverting the input clock timing; a parallel/serial converter unit for converting parallel signals once converted by the serial/parallel converter unit into a serial signal; a comparing and judging unit for comparing a serial signal from the parallel/serial converter unit with a serial signal from the serial/parallel converter unit, and for judging whether the serial/parallel converter unit has been converted at a predetermined timing; and a control unit for controlling so as to invert the input clock timing of the clock timing inverter unit in the serial/ parallel converter unit based on a result compared and judged by the comparing and judging unit when the serial/ parallel converter unit has not converted at the predetermined timing.

Further, the present invention is characterized in that a delay unit connected to the input of the comparing and judging unit for delaying a serial signal inputted to the serial/parallel converter unit by a predetermined timing to adjust a timing at which the serial signal inputted to the serial/parallel converter unit is compared with a serial signal from the parallel/serial converter unit.

Also, the present invention is characterized in that a phase adjusting unit is connected to the input of the parallel/serial converter unit for adjusting the phase of each of parallel signals from the serial/parallel converter unit.

Therefore, the serial/parallel converter circuit with an uncertainty removing function according to the present invention has the following advantages:

(1) When signals in serial form once subjected to a parallel/serial conversion is again subjected to a serial/ parallel conversion, an uncertainty is removed without depending on the signal pattern of the serial signals. Therefore the serial/paralel conversion can be certainly performed in a desired signal arrangement, thus improving its conversion accuracy.

(2) Accurate signals in parallel can be instantaneously outputted without judging whether there is an agreement in timing with the frame synchronous bit.

(3) Transmission information amount can be decreased because of no insertion bits.

(4) Even if signals travel from a radio transmission path to a cable transmission path, the serial/parallel conversion can be accurately performed without depending on the line quality of the radio communications section.

BRIEF DESCRIPTION OF THE DRAWINGS

FIG. 8 is a timing chart used for explaining an operation of a serial/parallel converter circuit with an uncertainty removing function according to the second embodiment of the present invention;

DESCRIPTION OF THE PREFERRED EMBODIMENTS

Figure 1:
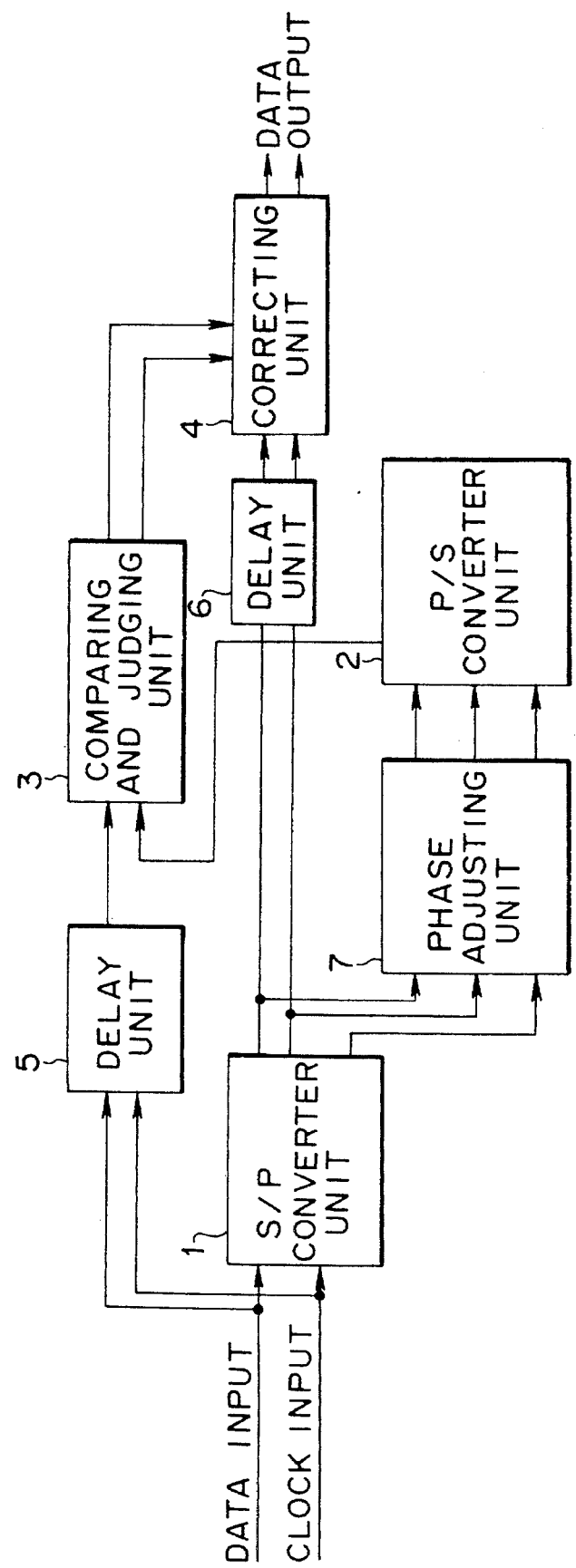
FIG. 1 is a block diagram showing the present invention.

Referring to the attached drawings, an explanation will be made in detail as for preferred embodiments of the serial/ parallel converter circuit according to the present invention.
(a) The aspect of the invention:

The aspect of the invention will be explained now with reference to the attached drawings. FIG. 1 is a block diagram showing an aspect of the present invention. Referring to FIG. 1, numeral 1 represents a serial/parallel converter unit. The serial/parallel converter unit 1 converts a serial signal (or signal bits in serial form) subjected to a parallel/serial conversion into parallel signals (or signal bits in parallel).

The parallel/serial converter unit 2 converts parallel signals converted by the serial/parallel converter unit 1 into a serial signal.

The comparing and judging unit 3 compares a serial signal from the parallel/serial converter unit 2 with a serial signal inputted to the serial/parallel converter unit 1 to judge whether the conversion has been made at a predetermined timing by the serial/parallel converter unit 1.

The correcting unit 4 corrects the parallel signals from the serial/parallel converter unit 1 based on the result compared and judged by the comparing and judging unit 3 when the conversion is not performed at a predetermined timing by the serial/parallel converter unit 1.

Moreover the delay unit 5 is connected to supply its output as the input of the comparing and judging unit 3 so to delay the received serial signal (which is simultaneously inputted to the serial/parallel converter unit 1) outputted to the unit 3 by a predetermined time, thus adjusting the timing at which the received serial signal received by the delay unit 5 is compared with the serial signal outputted from the parallel/serial converter unit 2.

The delay unit 6 is connected to supply its output as the input of the correcting unit 4 so as to delay parallel signals received by the delay unit 6 from the serial/parallel converter unit 1 by a predetermined time, thus adjusting and correcting the timing of the parallel signals supplied to the correcting unit 4 from the serial/parallel converter unit 1.

The phase adjusting unit 7 is connected to supply its output to the input of the parallel/serial converter unit 2 to adjust the phase of each of parallel signals received from the serial/parallel converter unit 1 and to supply the phase-adjusted signals to the parallel/serial converter unit 2.

Figure 2:
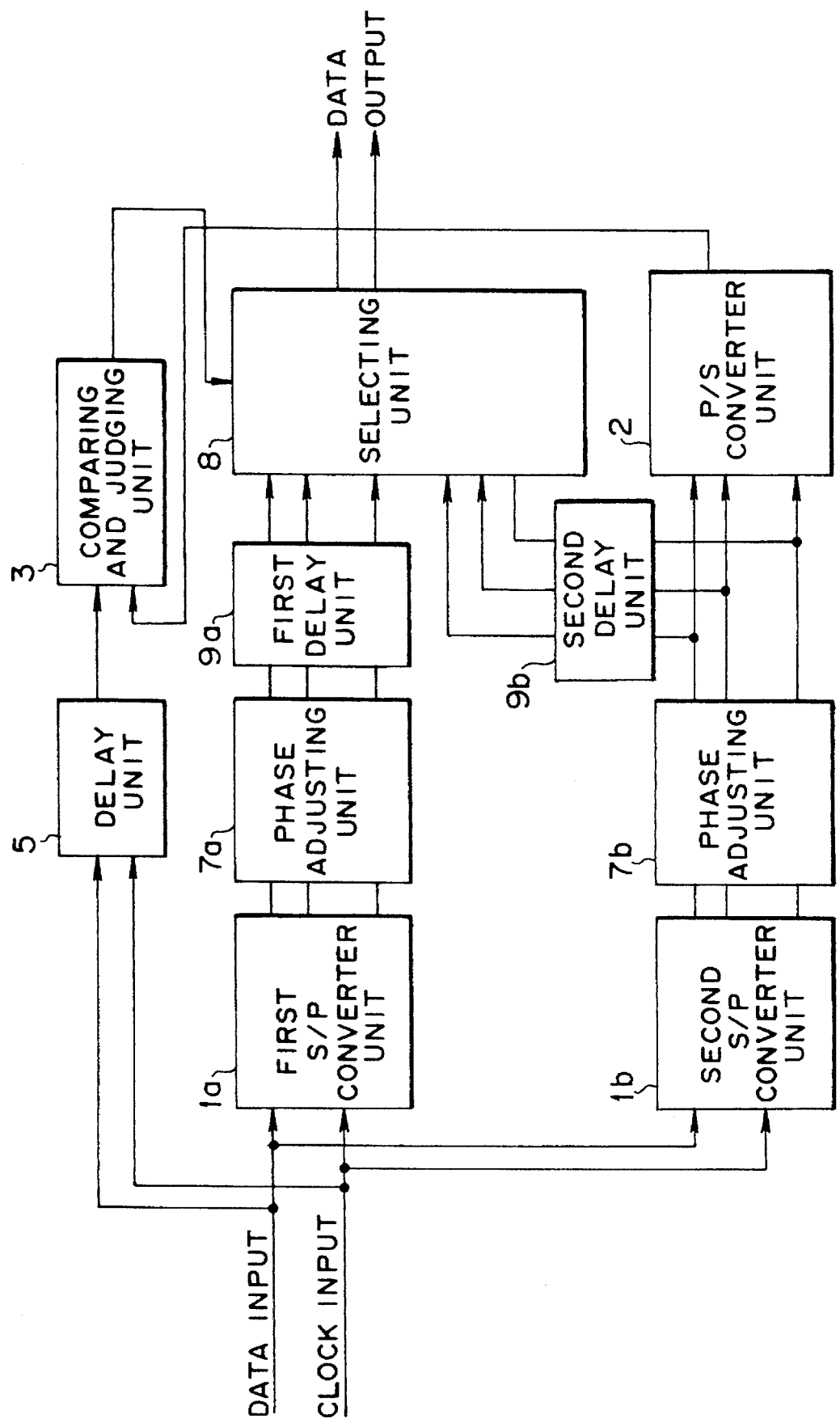
FIG. 2 is a block diagram showing a further aspect of the present invention.

FIG. 2 is a block diagram showing a further aspect of the present invention. Referring to FIG. 2, numeral 1a represents a first serial/parallel converter unit and 1b represents a second serial/parallel converter unit. The first serial/parallel converter unit 1a converts a received serial signal (in which the received serial signal has been formed originally by a parallel/serial conversion into parallel signals) at a first frequency dividing timing. The second serial/parallel converter unit 1b converts the same received serial signal (which has previously been subjected to a parallel/serial conversion) into parallel signals at a second frequency dividing timing different from the first frequency dividing timing in the first serial/parallel converter unit 1a.

The parallel/serial converter unit 2 converts parallel signals output by the second serial/parallel converter unit 1b into a serial signal.

The comparing and judging unit 3 compares a serial signal received from the parallel/serial converter unit 2 with a serial signal (which is the same as the received serial signal inputted to the first serial/parallel converter unit 1a and to the second serial/parallel converter unit 1b) to judge whether the second serial/parallel converter unit has converted the received parallel signal back into a serial signal having a correct timing.

Numeral 8 represents a selecting unit which receives the output of the unit 3 as well as processed outputs from the first and second serial/parallel converter units 1a and 1b. Based on the result compared and judged by the comparing and judging unit 3, the selecting unit 8 selects parallel signals from the serial/parallel converter unit 1b when a conversion is judged by the unit 3 to be made at a correct timing by the serial/parallel converter unit 1b. When the serial/parallel converter unit 1b is judged by the unit 3 as not converting at a correct timing, the selecting unit 8 selects parallel signals from the other one of the serial/parallel converter units, namely the first serial/parallel converter unit 1a.

The delay unit 5 is arranged to supply its output to the input of the comparing and judging unit 3 to delay a serial signal (which is the same as that received from the first serial/parallel converter unit 1a and the second serial/parallel converter unit 1b) by a first predetermined time, thus adjusting the timing at which the serial signal from the first serial/parallel converter unit 1a and the second serial/parallel converter unit 1b is compared with the serial signal received by the unit 3 from the parallel/serial converter unit 2.

Furthermore, numerals 9a and 9b represent a first delay unit and a second delay unit, respectively. The first delay unit 9a is connected to supply its output to the input of the selecting unit 8 to delay parallel signals received from the first serial/parallel converter unit 1a by a predetermined time. The second delay unit 9b is connected to supply its output to the input of the selecting unit 8 to delay parallel signals received from the second serial/parallel converter unit 1b by a predetermined time.

The phase adjusting unit 7b is connected to the input of the parallel/serial converter unit 2 to adjust the phase of each of parallel signals from the serial/parallel converter unit 1b.

The phase adjusting unit 7a is connected to receive the output of the serial/parallel converter unit 1a to adjust the phase of each of parallel signals from the serial/parallel converter unit 1a.

Figure 3:
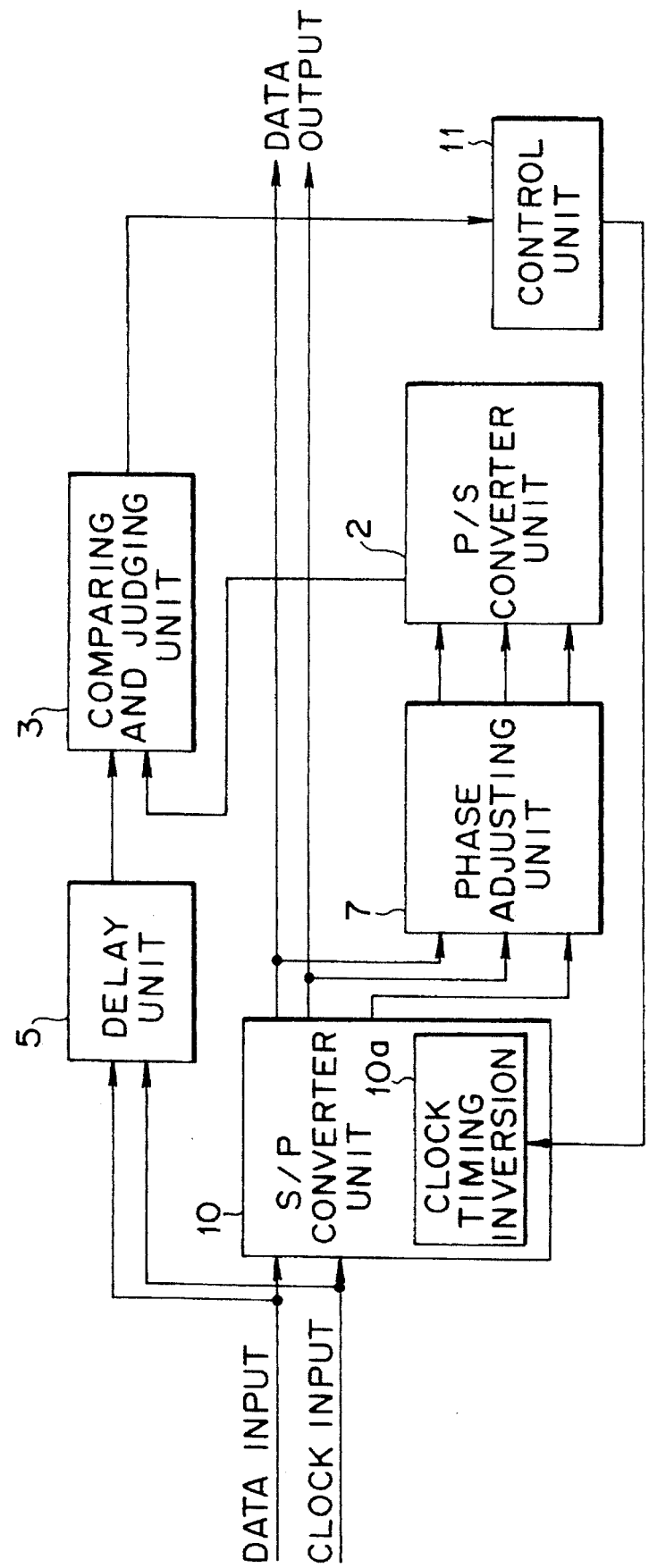
FIG. 3 is a block diagram showing another aspect of the present invention.

FIG. 3 is a block diagram showing another aspect of the present invention. Referring to FIG. 3, the serial/parallel converter unit 10 converts a serial signal (which has been previously subjected to a parallel/serial conversion) into parallel signals in accordance with an input clock timing. The serial/parallel converter unit 10 also has a clock timing inverter unit 10a for inverting an input clock timing.

The parallel/serial converter unit 2 converts parallel signals converted by the serial/parallel converter unit 10 into a serial signal.

The comparing and judging unit 3 compares a serial signal from the parallel/serial converter unit 2 with a serial signal inputted to the serial/parallel converter unit 10 to judge whether a conversion is made at a predetermined timing by the serial/parallel converter unit 10.

Numeral 11 represents a control unit. Based on the result compared and judged by the comparing and judging unit 3, the control unit 11 controls the inverter unit 10a in the serial/parallel converter unit 10 so as to invert an input clock timing when the serial/parallel converter unit does not convert at the correct timing.

The delay unit 5 is connected to the input of the comparing and judging unit 3 to delay the comparing timing to the serial signal inputted to the serial/parallel converter unit 10 by a predetermined time, thus adjusting the comparing timing to the serial signal from the parallel/serial converter unit 2.

The phase adjusting unit 7 is connected to the input of the parallel/serial converter unit 2 to adjust the phase of parallel signals from the serial/parallel converter unit 10, thus inputting the outcome to the parallel/serial converter unit 2.

As shown in FIG. 1, in the serial/parallel converter circuit with an uncertainty removing function according to the present invention, a serial signal once subjected to a parallel/serial conversion is first converted into parallel signals by the serial/parallel converter unit 1. Next, the parallel signals are converted into a serial signal form after the phases thereof are adjusted in the phase adjusting unit 7.

The comparing and judging unit 3 compares a serial signal converted by the parallel/serial converter unit 2 with the received serial signal inputted to the serial/parallel converter unit 1 to judge whether the conversion has been made at a correct timing by the serial/parallel converter unit 1.

The serial signal inputted to the comparing and judging unit 3 is delayed by a predetermined time by the delay unit 5 to adjust the comparing timing to the serial signal from the parallel/serial converter unit 2.

The correcting unit 4 corrects parallel signals from the serial/parallel converter unit 1 based on the result compared and judged by the comparing and judging unit 3 when the conversion has not been made at the correct timing by the serial/parallel converter unit 1.

In this case, the parallel signals from the serial/parallel converter unit 1 inputted to the correcting unit 4 are delayed by a predetermined time by the delay unit 6 to adjust the timing for correcting the parallel signals from the serial/parallel converter unit 1.

As shown in FIG. 2, in the serial/parallel converter circuit with an uncertainty removing function, a serial signal subjected to a parallel/serial conversion is converted into parallel signals at a frequency dividing timing by the first serial/parallel converter unit 1a. The serial signal (which was previously subjected to a parallel/serial conversion) is converted into parallel signals by the second serial/parallel converter unit 1b at a frequency dividing timing different from that in the first serial/parallel converter unit 1a.

The parallel signals converted by the first serial/parallel converter unit 1a are adjusted in phase by the phase adjusting unit 7a to delay by a predetermined time in the first delay unit 9a, whereby the result is outputted to the selecting unit 8. The second serial/parallel converter unit 1b performs the above mentioned signal processing in the phase adjusting unit 7b and the second delay unit 9b to output the result to the selecting unit 8.

The parallel/serial converter 2 converts into a serial signal parallel signals which were converted by the second serial/parallel converter unit 1b and then adjusted in phase by the phase adjusting unit 7b.

The comparing/judging unit 3 compares a serial signal from the parallel/serial converter unit 2 with the serial signal inputted to the first and second serial/parallel converter units 1a and 1b to judge whether one of the serial/parallel converter units has been converted at a correct timing.

The serial signal, which is inputted to the first serial/parallel converter unit 1a and the second serial/parallel converter unit 1b, is delayed by a predetermined time in the delay unit 5. The delayed serial signal is inputted to the comparing and judging unit 3 so that the timing at which the delayed signal is compared with the serial signal from the parallel/serial converter unit 2 is adjusted.

In the selection unit 8, based on the result from the comparing and judging unit 3, the parallel signals from the serial/parallel converter unit 1b are selected when the conversion therein is performed at a correct timing. On the other hand, the parallel signals from the other serial/parallel converter unit (in this case, the first serial/parallel converter unit 1a) are selected when the conversion in the one serial/parallel converter unit is not performed at the correct timing.

As shown in FIG. 3, in the serial/parallel converter circuit with an uncertainty removing function according to the present invention, the serial/parallel converter unit 10 converts a serial signal (which has previously been subjected to a parallel/serial conversion) is converted into parallel signals according to an input clock timing.

The parallel signals converted by the serial/parallel converter unit 10 are adjusted in phase by the phase adjusting unit 7 to input to the parallel/serial converter unit 2. The parallel signals inputted to the parallel/serial converter unit 2 are converted into a serial signal to output to the comparing and judging unit 5.

The comparing and judging unit 3 compares a serial signal from the parallel/serial converter unit 2 with a serial signal delayed by a predetermined time in the delay unit 5, the serial signal being inputted to the serial/parallel converter unit 10 to be subjected to a parallel/serial conversion, to judge whether the conversion has been made at a predetermined timing in the serial/parallel converter unit 10.

The control unit 11 controls so as to invert the input clock timing based on the result from the comparing and judging unit 3 when the conversion in the serial/parallel converter unit 10 has not been made at a correct timing.

That is, when the serial/parallel converter unit 10 receives a control from the control unit 11 to invert the input clock timing, the clock timing inverting unit 10a inverts the input clock timing.

As described above in detail the serial/parallel converter circuit with an uncertainty removing function according to the present invention has the following advantages:

(1) When a serial signal once subjected to a parallel/serial conversion is subjected again to a serial/parallel conversion, the parallel signals can be certainly converted in a desired arrangement without depending on the signal bit pattern of the serial signal, whereby the conversion accuracy can be improved.

(2) Parallel signals can be accurately outputted instantaneously without judging the agreement in time of the frame synchronous bit.

(3) The transmission information amount is made less because of no need of insertion bits.

(4) Even if signals travel from a radio transmission path to a cable transmission path, serial/parallel conversion can be accurately performed without depending on the line quality of the radio communication section.

(b) First Embodiment of the Present Invention:

An explanation will be made as for an embodiment of the present invention with reference to attached drawings.

Figure 4:
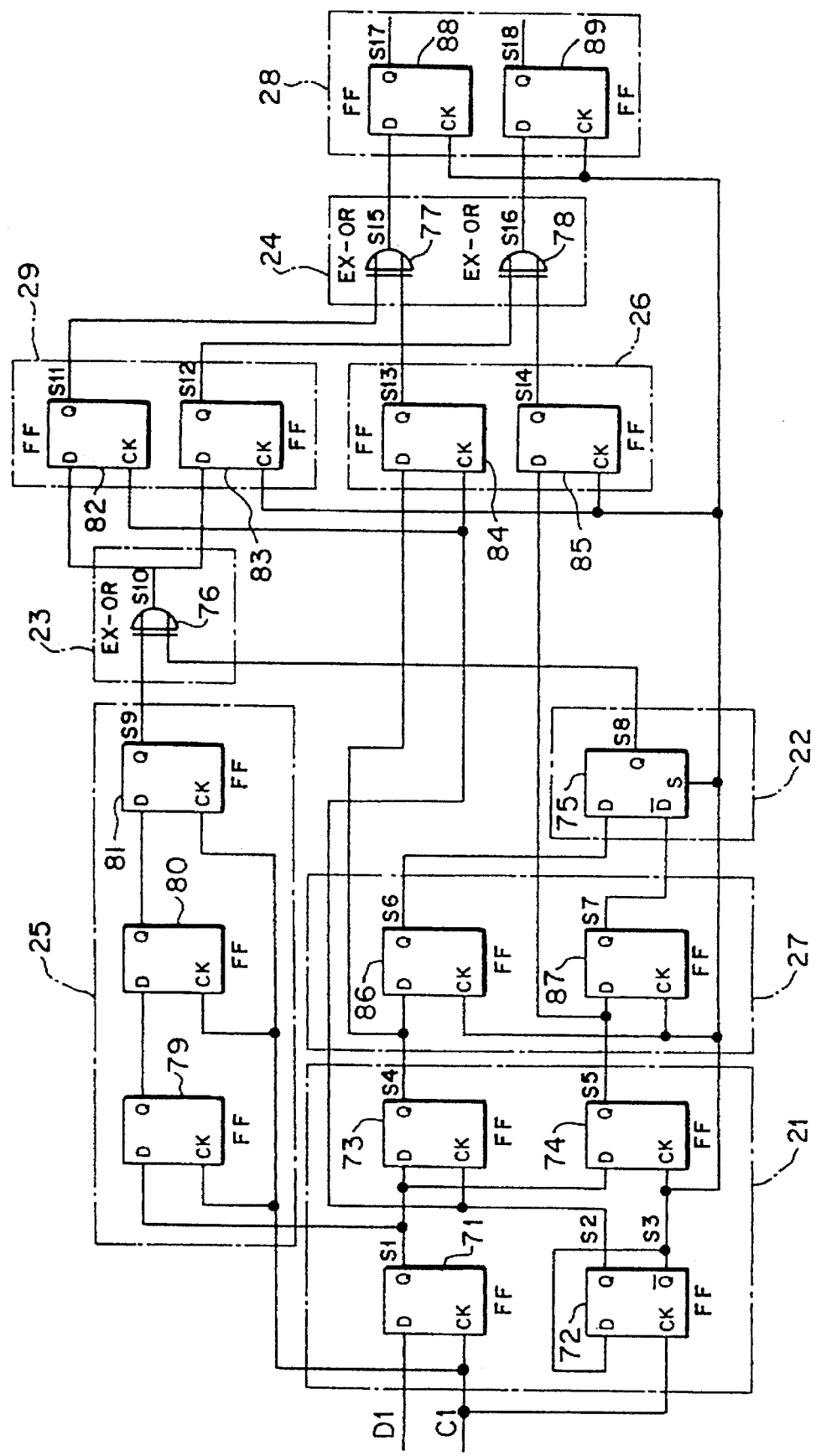
FIG. 4 is a block diagram showing a serial/parallel converter circuit with an uncertainty removing function according to a first embodiment of the present invention.

FIG. 4 is a block diagram showing the serial/parallel converter circuit with an uncertainty removing function according to the first embodiment of the present invention. Referring to FIG. 4, the serial/parallel converter circuit with an uncertainty removing function, for example, is used in a communications system including a cable communication section and a radio communication section. The serial/parallel converter circuit includes a serial/parallel converter unit 21, a parallel/serial converter unit 22, a comparing and judging unit 23, a correcting unit 24, delay units 25 and 26, and phase adjusting units 27 and 28.

The serial/parallel converter unit 21 converts a serial signal subjected to a parallel/serial conversion into parallel signals. The serial/parallel converter unit 21 is formed of four flip-flops 71 to 74.

The flip-flop 72 divides input clock pulses by 2 to produce two kinds of clock pulse chains (signals S2 and S3) which have a period twice that of the input clock pulses and are in the opposite phase to each other. The resultant clock pulses are used as a clock source for parallel signals.

When the serial signal is inputted to the flip-flop 71, the flip-flops 73 and 74 output respectively the signals S4 and S5 as parallel signals to the phase adjusting unit 27.

The phase adjusting unit 27 includes flip-flops 86 and 87. The phase adjusting unit 27 adjusts the phase of each of the parallel signals from the serial/parallel converter unit 21 and then outputs the result to the parallel/serial converter unit 22.

The parallel/serial converter unit 22 includes a selector 75. The parallel/serial converter unit 22 converts into a serial signal the parallel signals (signals S6 and S7) that are one subjected to a serial/parallel conversion in the serial/parallel converter unit 21 and adjusted in phase by the phase adjusting unit 27.

The delay unit 25 includes three flip-flops 79 to 81 connected in tandem. The delay unit 25 delays a serial signal inputted to the serial/parallel converter unit 21 by a predetermined time to adjust the timing at which the serial signal inputted to the serial/parallel converter unit 21 is compared with the serial signal from the parallel/serial converter unit 22, thus outputting the result to the comparing and judging unit 23.

The comparing and judging unit 23 compares the serial signal from the parallel/serial converter unit 22 with the serial signal inputted to the serial/parallel converter unit 21 to judge whether the conversion in the serial/parallel converter unit 21 has been performed at a correct timing. The comparing and judging unit 23 includes an exclusive-OR circuit (EX-OR) 76.

More specifically, when the two kinds of serial signals are inputted in phase, the bit information "O" is outputted. When the two kinds of the serial signals are in opposite phase, the bit information "1" is outputted.

The serial/parallel converter unit 29 is formed of a flip-flop 82 for receiving the signal S2 as an input clock and a flip-flop 83 for receiving the signal S3 as an input clock. The serial/parallel converter unit 29 converts the serial signal as a result from the comparing and judging unit 23 into the parallel signals, based on the signals (signals S2 and S3) acting as clock pulses which are outputted from the flip-flop 72 and are in opposite phase to each other.

The delay unit 26 includes flip-flops 84 and 85 which receive input clock pulses in opposite phase to each other. The delay unit 26 delays the parallel signals from the serial/parallel converter unit 21 by a predetermined time to adjust the correcting timing in the correcting unit 24.

The flip-flop 84 inputs as data the output from the flip-flop 73. The flip-flop 85 inputs as data the output from the flip-flop 74.

The correcting unit 24 includes exclusive OR circuits 77 and 78. The correcting unit 24 corrects parallel signals from the serial/parallel converter unit 21 based on the result from the comparing and judging unit 23 when the conversion has not been made at a correct timing in the serial/parallel converter unit 21.

That is, the exclusive OR circuit 77 receives the output as a compared and judged result from the flip-flop 82 and the output from the flip-flop 84 as a bit of parallel signals from the serial/parallel converter unit 21. The exclusive OR circuit 78 receives the output as a compared and judged result from the flip-flop 83 and the output from the flip-flop 84 as a bit of parallel signals from the serial/parallel converter unit 21. When the two resultant signals are different in logic level from each other, the output of the delay unit 26 is corrected.

The phase adjusting unit 28 includes flip-flops 88 and 89 which are operated with the same clocks. The phase adjusting unit 28 adjusts in phase the outputs as parallel signals from the exclusive OR circuits 77 and 78.

Figure 5:
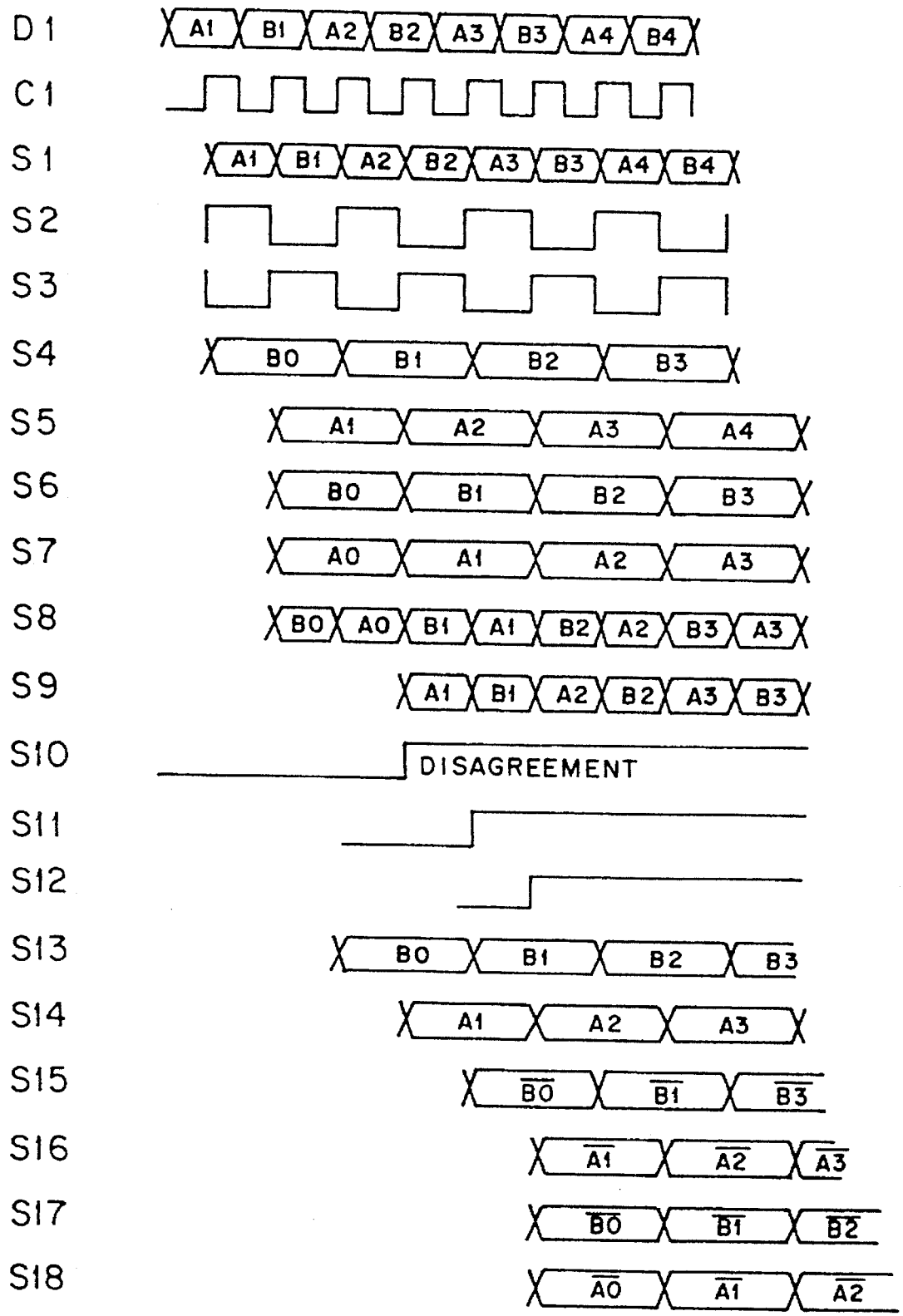
FIG. 5 is a timing chart used for explaining an operation of a serial/parallel converter circuit with an uncertainty removing function according to the first embodiment of the present invention.

An explanation will be made as for the operation of the serial/parallel converter circuit with an uncertainty removing function described above according to an embodiment of the present invention with reference to the timing chart shown in FIG. 5.

That is, when the serial/parallel converter unit 21 receives data D1 and a clock signal C1, the flip-flop 71 outputs a signal S1. The flip-flop 72 divides the frequency of the clock signal C1 by 2 to output signals S2 and S3 acting as two kinds of parallel clocks in opposite phase to each other and having a repetition period twice that of the clock signal C1.

The flip-flop receives the signal S1 acting as data from the flip-flop 71 and signal S2 acting as clock from the flip-flop 72 and outputs the signal S4. The flip-flop 74 receives the signal S1 acting as data from the flip-flop 71 and the signal S3 acting as clock from the flip-flop 72 and outputs the signal S5.

Therefore the parallel signals acting as the output from the serial/parallel converter unit 21 corresponds to signals S4 and S5, respectively. The parallel signals have a sign length twice that of the data D1 because signals S2 and S3 with a period twice that of the clock C1 are used as clocks.

The serial/parallel converter unit 21 outputs parallel signals to the phase adjusting unit 27. That is, the flip-flops 86 and 87 input the signals S4 and S5, respectively, and then output the signals S6 and S7 phase-adjusted.

The signals S6 and S7 are produced by adjusting the shifted phase between the signals S4 and S5 as the output from the serial/parallel converter unit 21. The signals S6 and S7 allow the parallel/serial converter unit 22 to perform a parallel/serial conversion.

The parallel/serial converter unit 22 inputs the signals S6 and S7 and outputs the signal S8. That is, the selector 75 selects the signal S6 at the rise time of the signal S3 and selects the signal S7 at the falling time of the signal S3 to output a serial signal as the signal S8.

The comparing and judging unit 23 inputs a serial signal from the serial/parallel converter unit 21 together with the signal S8. The serial signal corresponds to the signal S9 that is made by delaying the signal S1 by the flip-flops 79 to 81 in the delay unit 25, the signal S1 being formed by shaping the input data D1 by the flip-flop 71 triggered with the clock C1.

In the comparing and judging unit 23, the exclusive OR circuit 76 compares the signal S8 with the signal S9. When the signals S8 and S9 are inputted in phase, it is judged that the serial/parallel converter 21 has converted at a desired timing so that the bit information "O" is outputted. When the signals S8 and S9 are inputted in opposite phase to each other, it is judged that the serial/parallel converter 21 has not converted at the desired timing so that the bit information "1" is outputted.

In this example, since the signal S8 is out of phase to the signal S9, the bit information "1" is outputted as the signal S10.

In the serial/parallel converter unit 29, the flip-flop 82 shapes the signal S10 from the comparing and judging unit 23 with the signal S2 as clock to output the signal S11 while the flip-flop 83 shapes the signal S10 from the comparing and judging unit 23 with the signal S3 as clock to output the signal S12. The correcting unit 24 outputs the signal S11 and the signal S12 as parallel signals.

The flip-flop 84 shapes a bit of the parallel signals from the serial/parallel converter unit 21 with the signal S2 as clocks to output the signal S13 while the flip-flop 85 shapes a bit of the parallel signals from the serial/parallel converter unit 21 with the signal S3 as clocks to output S14. The correcting unit 24 delays the signal S13 and signal S14 by a predetermined time to adjust its correcting timing.

In the correcting unit 24, the exclusive OR circuit 77 receives the signal S11 as a compared and judged result and the signal S13 as an output from the serial/parallel converter unit 21. The exclusive OR circuit 78 receives the signal S12 and the signal S14. The correcting unit 24 outputs the signals S15 and S16 as corrected parallel signals.

In the phase correcting unit 28, the flip-flop 88 adjusts in phase the signal S15 being a bit of the corrected parallel signals to output the signal S17 and the flip-flop 89 adjusts in phase the signal S16 being a bit of the corrected parallel signals to output the signal S18.

According to the present embodiment, in the communications system, for example, where a cable communication section coexists with a radio communication section, a radio communication section relays communications between cable communication sections by forwarding a serial signal once subjected to a parallel/serial conversion in the radio communication section and then transmitting parallel signals again subjected to a serial/parallel conversion in the cable section. In this case, there are advantages: (1) an uncertainty can be removed without depending on the line quality of the radio communication section; (2) a serial/parallel conversion can be performed to arrange, certainly and instantaneously, signal bits in a desired arrangement; and (3) the conversion accuracy and conversion rate can be improved.

Moreover, there is an advantage in that when a cable communication section is transferred to a radio communication section, it is not needed to insert any insertion bit to the serial signal subjected to a parallel/serial conversion, whereby communications can be performed with a lesser required amount of information.

(c) Second Embodiment of the Present Invention:

Next, the second embodiment of the present invention will be explained below.

Figure 6:
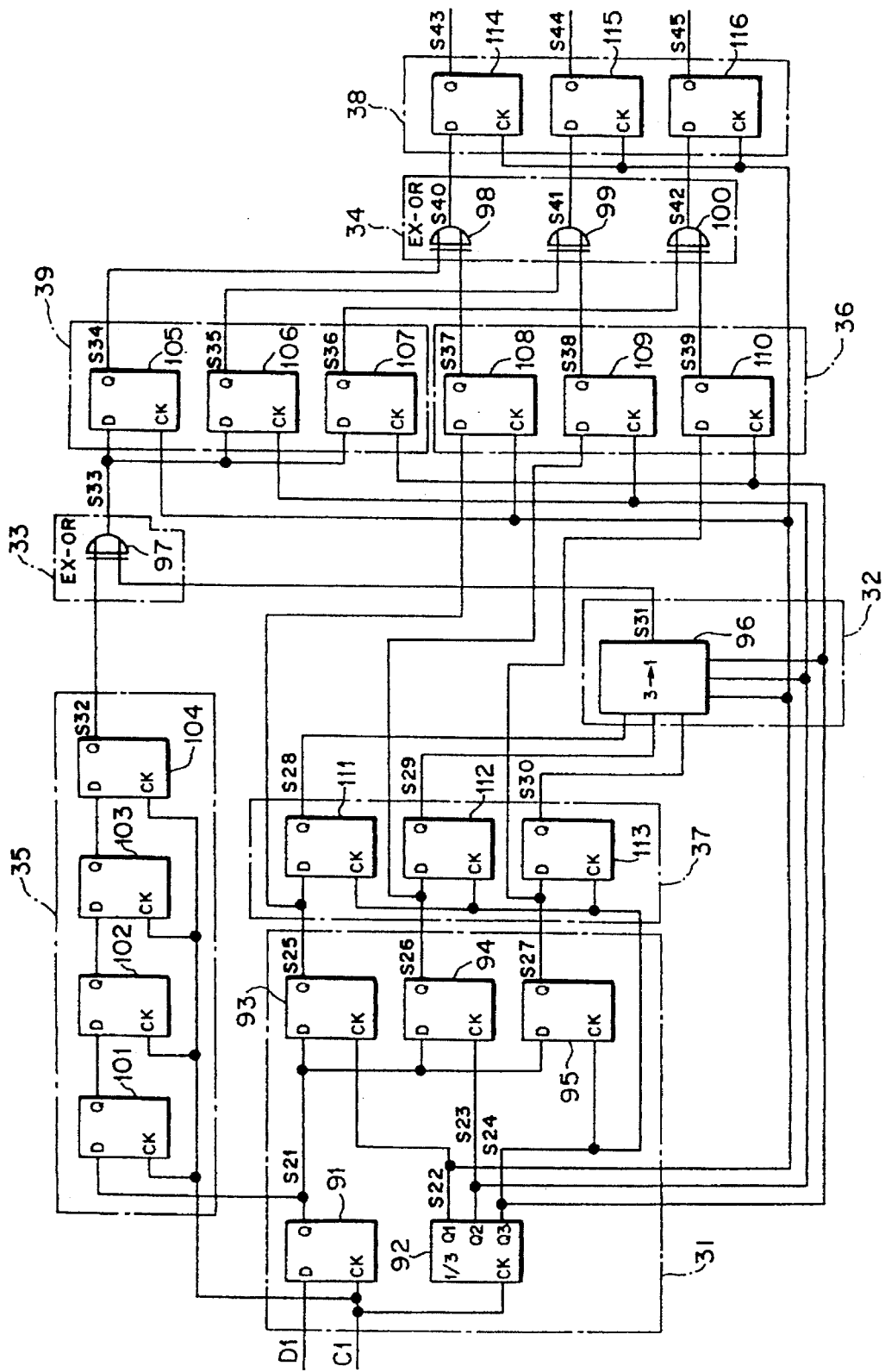
FIG. 6 is a block diagram showing a serial/parallel converter circuit with an uncertainty removing function according to a second embodiment of the present invention.

FIG. 6 is a diagram showing the serial/parallel converter circuit with an uncertainty removing function according of the second embodiment of the invention. In the serial/parallel converter circuit with an uncertainty removing function according to the first embodiment, the serial signal is converted into two parallel signals. However, the serial/parallel converter circuit with an uncertainty removing function according to the second embodiment is different from the first embodiment in that the serial is converted into three parallel signals.

That is, like the serial/parallel converter circuit in the first embodiment, the serial/parallel converter circuit according to the second embodiment can be used in the communications system including, for example, cable communication sections together with radio communication sections.

Therefore, from the viewpoint of functions of various constitutive elements, the serial/parallel converter circuit according to the second embodiment is basically similar to that in the first embodiment except that the parallel signals are formed of three outputs.

In FIG. 6, the serial/parallel converter unit 31 corresponds to the serial/parallel converter unit 21 in the first embodiment but outputs three parallel output signals. The serial/parallel converter unit 31 also includes flip-flops 91 to 95.

The flip-flop 92 divides an input clock by 3 in frequency to produce three kinds of clocks having a period three times that of the serial clock and a different phase to one another. The three kinds of clocks are used as a clock source for parallel signals.

When the serial signal is inputted to the flip-flop 91, the flip-flops 93 to 95 outputs parallel signals to the phase adjusting unit 37.

The phase adjusting unit 37, which corresponds to the phase adjusting unit 27 in the first embodiment, includes flip-flops 111 to 113.

The parallel/serial converter unit 32 converts three parallel output signals from the serial/parallel converter unit 31 into a serial signal. The parallel/serial converter unit 32 includes a selector 96 and corresponds to the parallel/serial converter unit 22 in the first embodiment.

The delay unit 35, which corresponds to the delay unit 25 in the first embodiment, includes four flip-flops 101 to 104 arranged in tandem.

The comparing and judging unit 33 functions similarly to the comparing and judging unit 23 in the first embodiment. The comparing and judging unit 33 also has an exclusive OR circuit (EX-OR) 97.

The serial/parallel converter unit 39, which corresponds to the serial/parallel converter unit 29 in the first embodiment, has three flip-flops 105 to 107 to convert the result from the comparing and judging unit 33 into three parallel signals.

The delay unit 36 corresponds to the delay unit 26 in the first embodiment. The delay unit 26 also includes three flip-flops 108 to 110 triggered with the same clocks to respond the parallel signals inputted from the serial/parallel converter unit 31.

The flip-flop 108 receives as data the output from the flip-flop 93. The flip-flop 109 receives as data the output from the flip-flop 94. The flip-flop 110 receives as data the output from the flip-flop 95.

The correcting unit 34 corresponds to the correcting unit 24 in the first embodiment. The correcting unit 34 also includes three exclusive OR circuits 98 to 100 to provide three output signal bits in parallel.

That is, the exclusive OR circuit 98 inputs the output from the flip-flop 105 as a compared and judged result and the output from the flip-flop 108 as a bit of parallel signals subjected to a serial/parallel conversion. The exclusive OR circuit 99 inputs the output from the flip-flop 106 as a compared and judged result and the output from the flip-flop 109 as a bit of parallel signals subjected to a serial/parallel conversion. The exclusive OR circuit 100 inputs the output from the flip-flop 107 as a compared and judged result and the output from the flip-flop 110 as a bit of parallel signals subjected to a serial/parallel conversion. When two output signals are different from each other, the correcting unit 34 corrects signal bits from the delay unit 36 and then outputs the corrected signal bits.

The phase adjusting unit 38 corresponds to the phase adjusting unit 28 in the first embodiment. The phase adjusting unit 38 also includes three flip-flops 114 to 116 each triggered with the same clock.

The operation of the serial/parallel converter circuit with an uncertainty removing function according to the second embodiment of the present invention will be explained below with reference to the timing charts shown in FIGS. 7 and 8.

Figure 7:
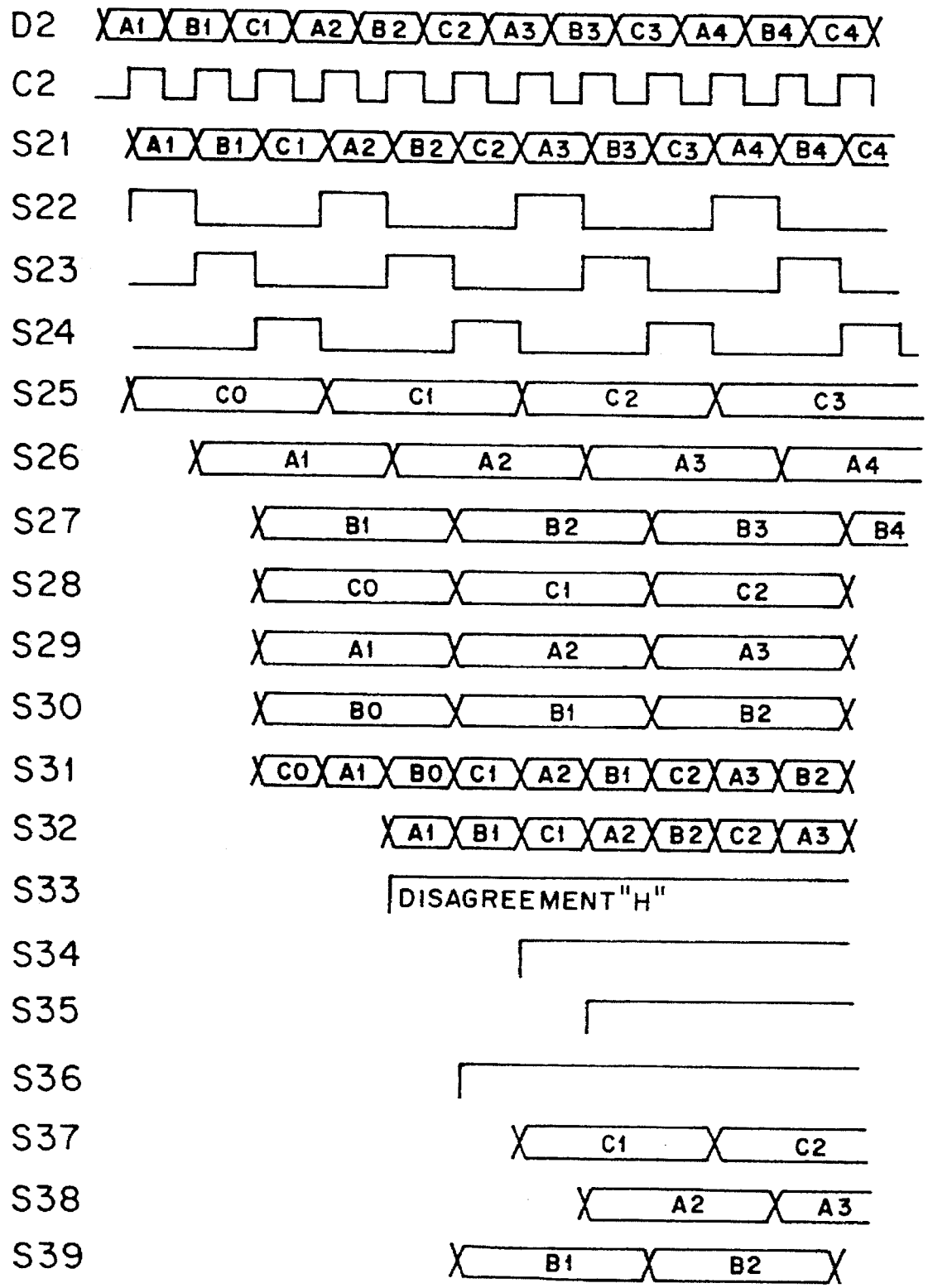
FIG. 7 is a timing chart used for explaining an operation of a serial/parallel converter circuit with an uncertainty removing function according to a second embodiment of the present invention.

That is, when data D2 and a clock C2 are inputted to the serial/parallel converter unit 31, the flip-flop 91 outputs a signal S21 (refer to FIG. 7).

The flip-flop 92 divides the clock by 3 in frequency to output three kinds of clocks in parallel (signals S22 to S24 in FIG. 7) each having a period three times that of the clock C2.

The flip-flops 93 to 95 input signals S21 from the flip-flop 91 as data and signals S22 to S24 as clocks, respectively. The flip-flops 93 to 95 output signals S25 to S27, respectively.

The parallel signals have a sign length three times that of the data D2 because the signals S22 to S24 having a period three times that of the clock C2 are used as clocks.

The serial/parallel converter unit 31 inputs parallel signals (signals S25 to S27) to the phase adjusting unit 37. The signals S25 to S27 are respectively inputted to the flip-flops 111 to 113 to output as signals S28 to S30 adjusted in phase.

The parallel/serial converter unit 32 inputs signals S28 to S30 in response to signals S22 to S24 as clocks to output a signal S31. The selector 96 selects a signal S28 by detecting a pulse from the signal S22, selects a signal S29 by detecting a pulse from the signal S24. As a result, the selector 96 produces a serial signal (signal S31).

The signal S21, which is the input data D2 shaped with the flip-flop 91 in response to the clock C2, is inputted to the delay unit 35. In the delay unit 35, the flip-flops 101 to 104 input a signal S32 delayed by a predetermined time to the comparing and judging unit 33.

The comparing and judging unit 33 inputs a signal S32 together with the serial signal (signal S31) from the parallel/serial converter unit 32.

That is, the exclusive OR circuit 97 in the parallel/serial converter unit 32 compares the signal S31 with the signal S32 inputted. When the signals S31 and S32 are inputted in phase, it is judged that the conversion has been performed at a correct or desired timing in the serial/parallel converter unit 31 so that the bit information "0" is outputted. When the signals S31 and S32 are inputted in the opposite phase, it is judged that the conversion has not been performed at a desired (i.e., correct) timing in the serial/parallel converter unit so that bit information "1" is outputted.

In this example, since the signal S31 is shifted in phase to the signal S32, the bit information "1" is outputted as a serial signal (signal S33).

The serial/parallel converter unit 39 receives a serial signal from the comparing and judging unit 33 and outputs it as three parallel output signals (signals S34, S35, and S36) to the correcting unit 34.

The flip-flops 108 to 110 in the delay unit 36 shape the parallel signals converted by the serial/parallel converter unit 31 in response to signals S22 to S24 as clocks. The delay unit 34 delays the parallel signals by a predetermined time to adjust the correcting timing.

The correcting unit 34 inputs the compared and judged result (signals S34 to S36) from the serial/parallel converter unit 39 and parallel signals adjusted in phase (signals S37 to S39) and corrects parallel signals (signals S37 to S39) (signals S40 to S42 in FIG. 8).

In the phase adjusting unit 38, the flip-flops 88 and 89 adjust the phases of the corrected parallel signals or signals S40 and S42 with the same clocks (signals S43 to S45 in FIG. 8).

As described above, like the first embodiment, in the communications system, for example, including cable communication sections together with radio communication sections, the radio communication section relays communications between cable communication sections where a serial signal form obtained through a parallel/serial conversion is transmitted in a radio communication section and parallel signals again subjected to a serial/parallel conversion are transmitted in a cable communication section. In this case, the present embodiment has advantages in that an uncertainty can be removed without depending on the line quality of the radio communication section, and a serial/parallel conversion can be performed instantaneously and certainly to arrange signal bits in a desired arrangement, whereby conversion accuracy and conversion rate can be improved.

Furthermore, there is an advantage in that when a cable communication section is transferred to a radio communication section, it is not necessary to insert an insert bit to the serial signal subjected to a parallel/serial conversion so that communications can be performed with a lesser amount of information.

Figure 9:
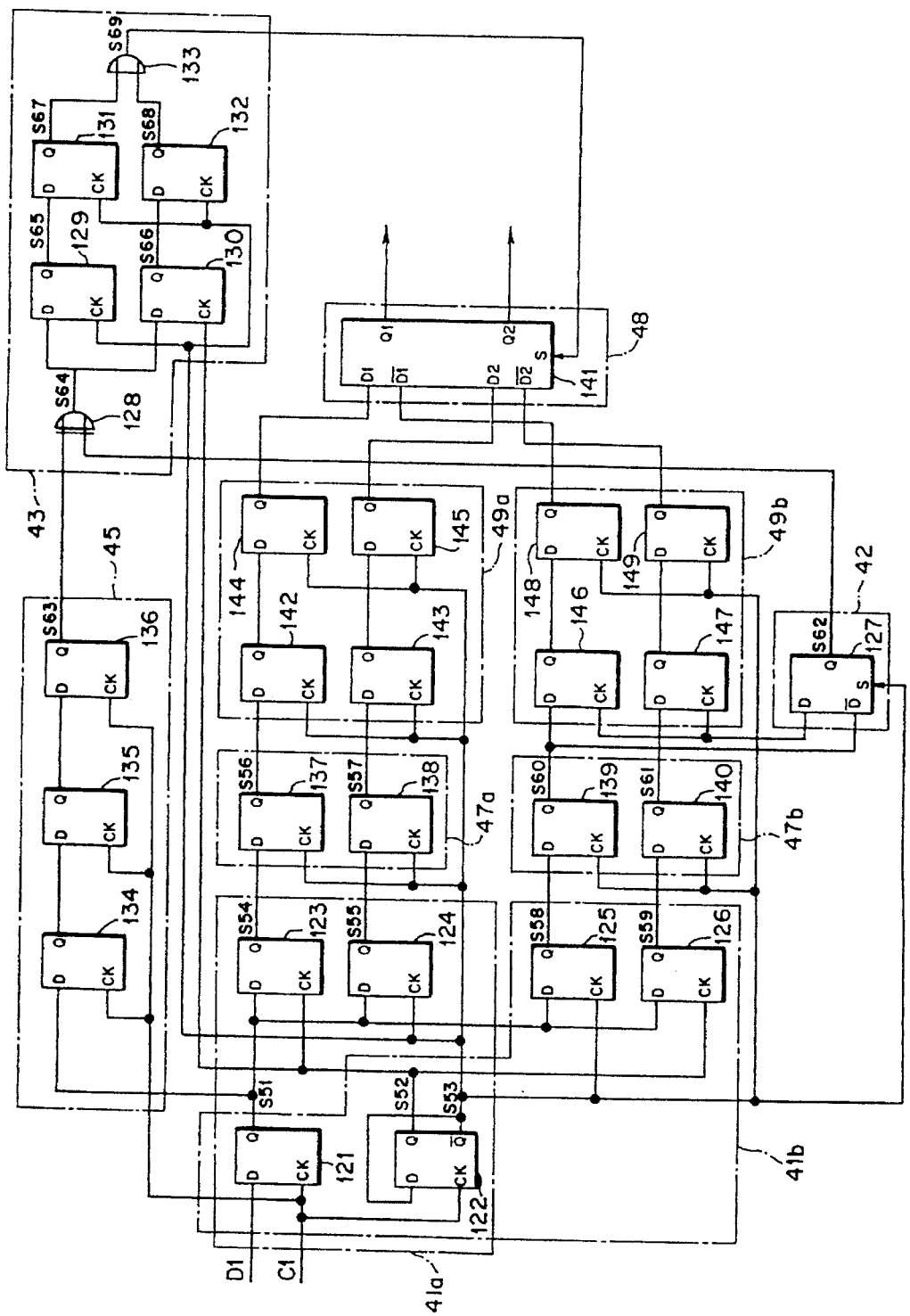
FIG. 9 is a block diagram showing a serial/parallel converter circuit with an uncertainty removing function according to the third embodiment of the present invention.

(d) Third Embodiment of the Present Invention:

FIG. 9 is a diagram showing the serial/parallel converter circuit with an uncertainty removing function according to the third embodiment of the present invention. Like the first and second embodiments, the serial/parallel converter circuit with an uncertainty removing function according to the present embodiment can be used between the cable communication section and the radio communication section in, for example, the communications system including cable communication sections and radio communication sections.

In FIG. 9, the first serial/parallel converter unit 41a converts a serial signal into parallel signals at a timing and the second serial/parallel converter unit 41b converts a serial signal into parallel signals at a timing different from that of the first serial/parallel converter unit 41a.

That is, the first serial/parallel converter unit 41a includes a flip-flop 121 for shaping input data D1 and input clock C1, a flip-flop 122 for dividing the input clock C1 by 2 in frequency to produce two kinds of clocks having a period twice the input clock C1 and a phase opposite to each other, and flip-flops 123 and 124 for outputting parallel signals, respectively.

The second serial/parallel converter unit 41b includes flip-flops 121 and 122 shared with the first serial/parallel converter unit 41a, and flip-flops 125 and 126 for outputting parallel signals.

That is, the signal S52 or clock signal from the flip-flop 122 is inputted to the flip-flop 123 in the first serial/parallel converter unit 41a and the flip-flop 126 in the second serial/parallel converter unit 41b. The signal S53 is inputted to the flip-flop 124 in the first serial/parallel converter unit 41a and the flip-flop 125 in the second serial/parallel converter unit 41b.

Therefore, since the clocks of the first serial/parallel converter unit 41a and the second serial/parallel converter unit 41b are in the opposite phase to each other, the parallel signals are outputted in opposite phase.

The phase adjusting unit 47a adjusts the phase of the parallel signals from the first serial/parallel converter unit 41a and the phase adjusting unit 47b adjusts the phase of the parallel signals from the second serial/parallel converter unit 41b.

The phase adjusting unit 47a includes flip-flops 137 and 138 that are triggered with the same clock or the signal S53 from the flip-flop 122. The phase adjusting unit 47b includes flip-flops 139 and 140 that triggered with the same clock or the signal S53 from the flip-flop 122.

The first delay unit 49a delays parallel signals (signals S56 and S57) from the phase delay unit 47a by a predetermined time and produces the outcome to the selecting unit 48. The second delay unit 49b delays parallel signals (signals S60 and S61) from the phase delay unit 47b by a predetermined time and produces the outcome to the selecting unit 48.

The phase delay unit 47a includes flip-flops 142 to 145 while the phase delay unit 47b includes flip-flops 146 to 149.

The parallel/serial converter unit 42 inputs parallel signals (signals S60 and S61) from the phase adjusting unit 47b to convert into a serial signal. The parallel/serial converter unit 42 includes a selector 127 clocked with the signal S53.

The delay unit 45 delays the serial signal shaped by the flip-flop 121 by a predetermined time and outputs the outcome to the comparing and judging unit 43. The delay unit 45 includes three flip-flops 134 to 136 connected in tandem.

The comparing and judging unit 43 inputs the signal (signal S62) subjected to a parallel/serial conversion in the parallel/serial converter unit 42 and the signal (signal S63) delayed in the delay unit 45 to judge whether the parallel signals have been converted at a predetermined timing by the second serial/parallel converter unit 41b. The comparing and judging unit 43 includes exclusive OR circuits 128 and 133 and flip-flops 129 to 132.

The selecting unit 48 selects the parallel signals from either the first serial/parallel converter unit 41a or the second serial/parallel converter unit 41b based on the result from the comparing and judging unit 43. The selecting unit 48 includes a selector 141.

More specifically, if the parallel signals are obtained by converting at a correct timing in the second serial/parallel converter 41b, the selecting unit 48 selects the same. If the parallel signals are not obtained by converting at a correct timing in the second serial/parallel converter 41b, the selecting unit 48 selects the parallel signals converted by the first serial/parallel converter unit 41a.

Figure 10:
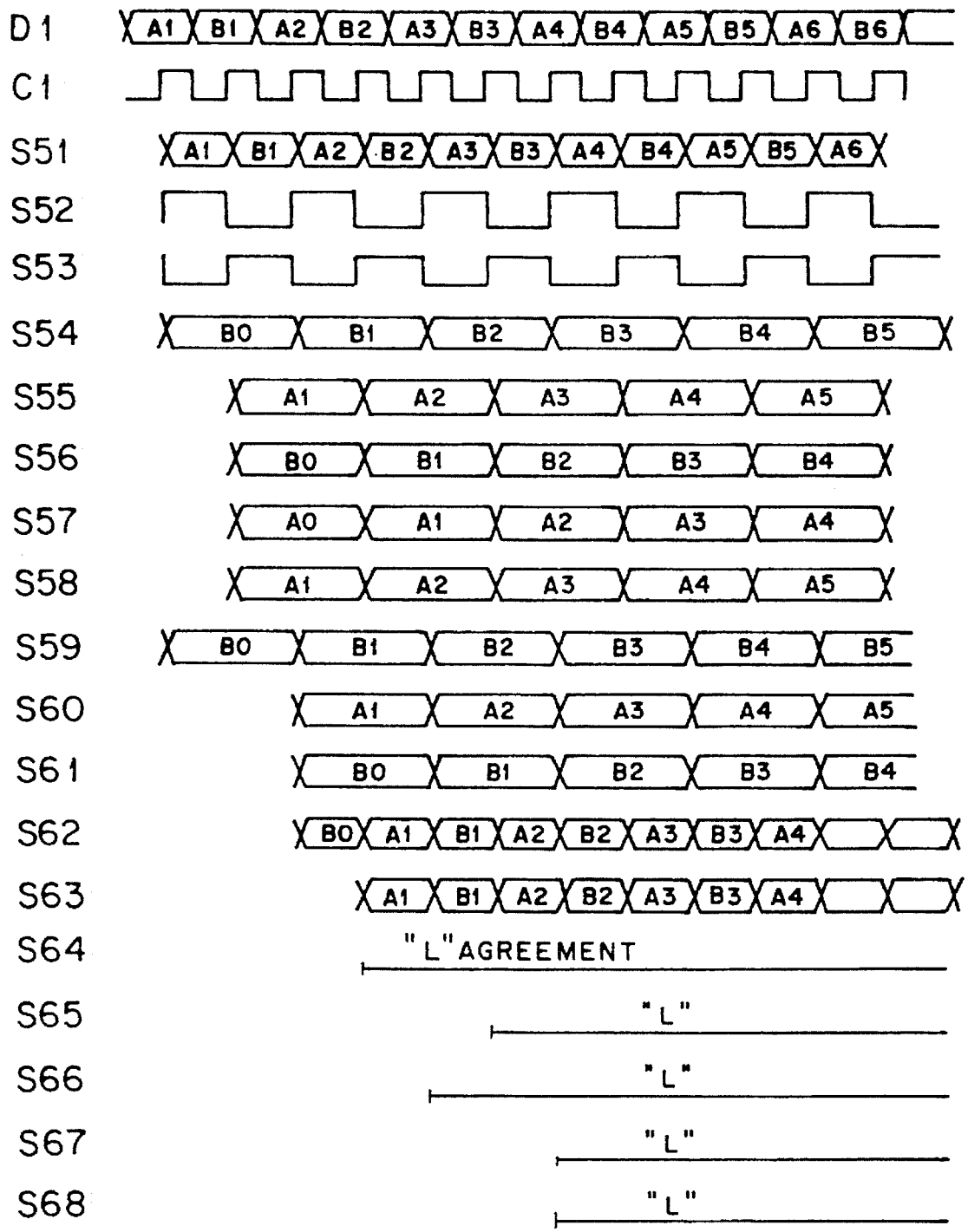
FIG. 10 is a timing chart used for explaining an operation of a serial/parallel converter circuit with an uncertainty removing function according to the third embodiment of the present invention.

The operation of the serial/parallel converter circuit with an uncertainty removing function according to the above embodiment will be explained with reference to FIG. 10.

That is, when the serial/parallel converter unit 41a receives input data D1 and input clock C1, the flip-flop 121 outputs the shaped data signal (signal S51) while flip-flop 122 outputs two kinds of clocks (signals S52 and S53).

The first serial/parallel converter unit 41a and the second serial/parallel converter unit 41b output parallel signals each having a different phase, based on two kinds of the clocks.

The parallel signals (signals S54 and S55), which are outputted from the first serial/parallel converter unit 41a, are adjusted in phase by the phase adjusting unit 47a. The resultant signals S56 and S57 are delayed by a predetermined time in the first delay unit 49a, then being sent to the selecting unit 48.

The parallel signals (signals S58 and S59), which are outputted from the second serial/parallel converter unit 41b are adjusted in the phase in the adjusting unit 47b. The resultant signals are delayed by a predetermined time by the delay unit 49a, then being sent to the selecting unit 48. The resultant signals (signals S60 and S61), which are adjusted in phase in the phase adjusting unit 47b, are converted into a serial signal in the parallel/serial converting unit 42 to output to the comparing and judging unit 43.

The serial signal, which is obtained by shaping input data by the flip-flop 121, is delayed by a predetermined time by the delay unit 45. At the same processing time, the resultant signal is inputted together with the serial signal from the parallel/serial converter unit 42 to the comparing and judging unit 43.

The comparing and judging unit 43 compares two serial signals. When the conversion of the second serial/parallel converter 41b is performed at a correct timing, a control signal which selects the parallel signals from the second serial/parallel converter unit 41b is outputted to the selecting unit 48. When the conversion of the second serial/parallel converter 41b is not performed at a correct timing, a control signal which selects the parallel signals from the first serial/parallel converter unit 41a is outputted to the selecting unit 48.

The selecting unit 48 selects one of two kinds of parallel signals, based on the control signal from the comparing and judging unit 43, and outputs it.

According to the present invention, in the communications system, for example, including cable communication sections together with radio communication sections and including a radio communication section relaying information between cable communication sections, a serial signal obtained through a parallel/serial conversion is transmitted in a radio communication section and then the parallel signals again subjected to a serial/parallel conversion are transmitted in a cable communication section. In this case, the present embodiment has advantages in that an uncertainty can be removed without depending on the line quality of the radio communication section and a serial/parallel conversion can be performed instantaneously and certainly to arrange signal bits in a desired arrangement, whereby conversion accuracy and conversion rate can be improved.

Furthermore, there is an advantage in that when a cable communication section is transferred to a radio communication section, it is not needed to insert an insert bit to the serial signal subjected to a parallel/serial conversion so that communications can be performed with a lesser required amount of information.

(e) Fourth Embodiment of the Present Invention:

Next, the fourth embodiment according to the present invention will be explained below.

Figure 11:
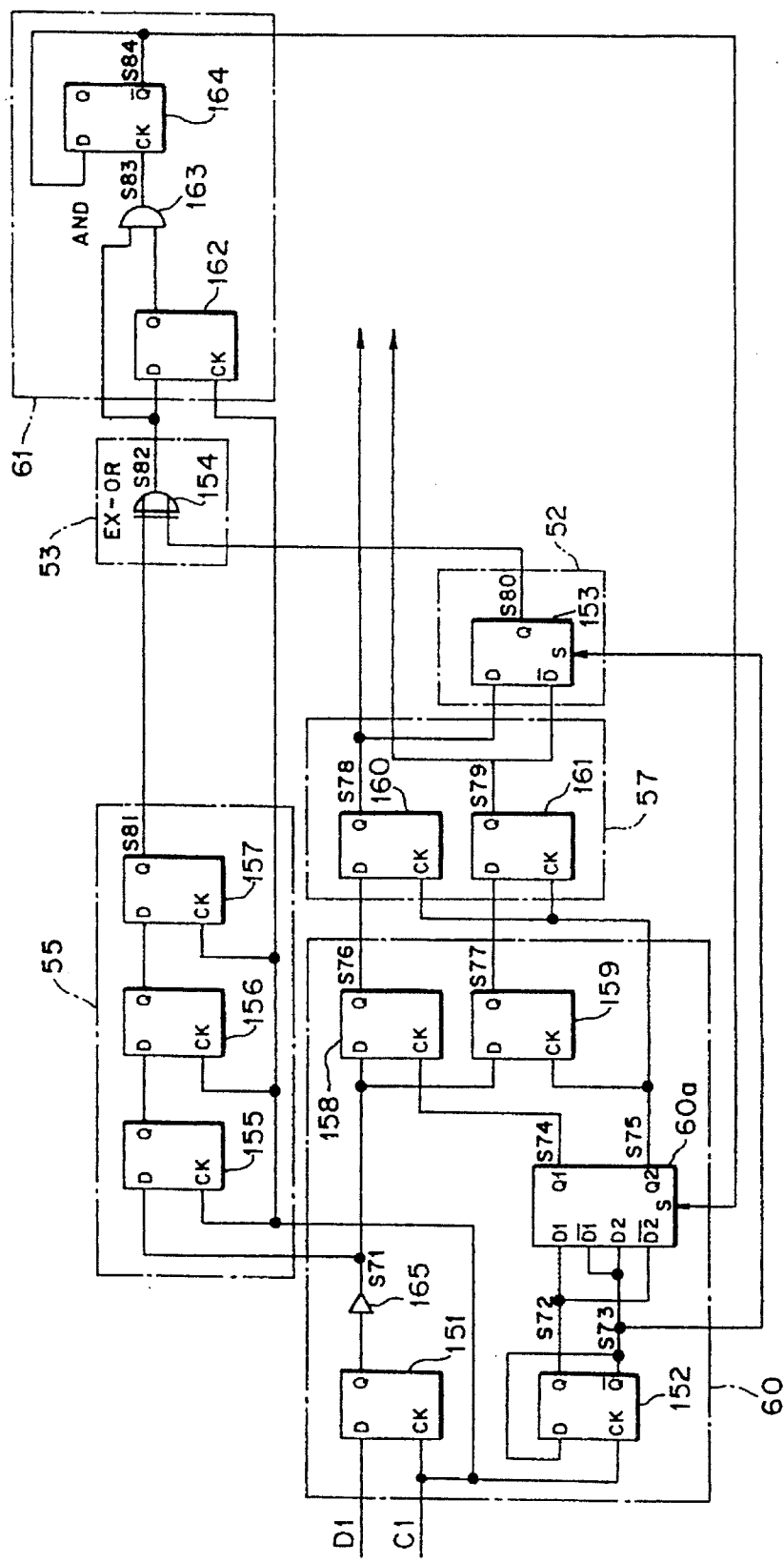
FIG. 11 is a block diagram showing a serial/parallel converter circuit with an uncertainty removing function according to the fourth embodiment of the present invention.

FIG. 11 is a diagram showing the serial/parallel converter circuit with an uncertainty removing function according to the fourth embodiment of the present invention. Like the first to third embodiments, the serial/parallel converter circuit with an uncertainty removing function according to the present embodiment can be used between a cable communication section and a radio communication section in, for example, a communications system including cable communication sections and radio communication sections.

Referring to FIG. 11, the serial/parallel converter unit 60 converts an input serial signal into parallel signals. The serial/parallel converter unit 60 includes a selector 60a acting as a clock timing inverter unit for inverting a clock timing to convert into parallel signals.

That is, the serial/parallel converter unit 60 includes a selector 60a, a flip-flop 151 having a function similar to those of the flip-flops 71 and 121 in the first and third embodiments, and a flip-flop 152 having a function similar to those of the flip-flops 72 and 122 in the first and third embodiments.

The selector 60a selects one of two kinds of clocks (signals S72 and S73) from the flip-flop 152, based on the control signal from the control unit (protective circuit) 61 (to be described later), to output as the signals S74 and 75.

Flip-flops 158 and 159 output desired parallel signals by being triggered with a clock from the selector 60a.

Based on the result from the comparing and judging unit 53, the control unit 61 outputs a clock signal as a control signal selected by the selector 60a without change when the parallel signals converted is one converted at a correct timing by the serial/parallel converter unit 60. When the parallel signals converted are not one converted at a correct timing by the serial/parallel converter unit 60, the control unit 61 outputs an inverted clock selected by the selector 60a. The control unit 61 includes flip-flops 162 and 164 and an OR circuit 163.

The parallel/serial converter unit 52, the comparing and judging unit 53, the delay unit 55 and the phase adjusting unit 57 correspond basically to the parallel/serial converter unit 22, the comparing and judging unit 23, the delay unit 25 and the phase adjusting unit 27. Explanation will be omitted as for the above mentioned elements.

Figure 12:
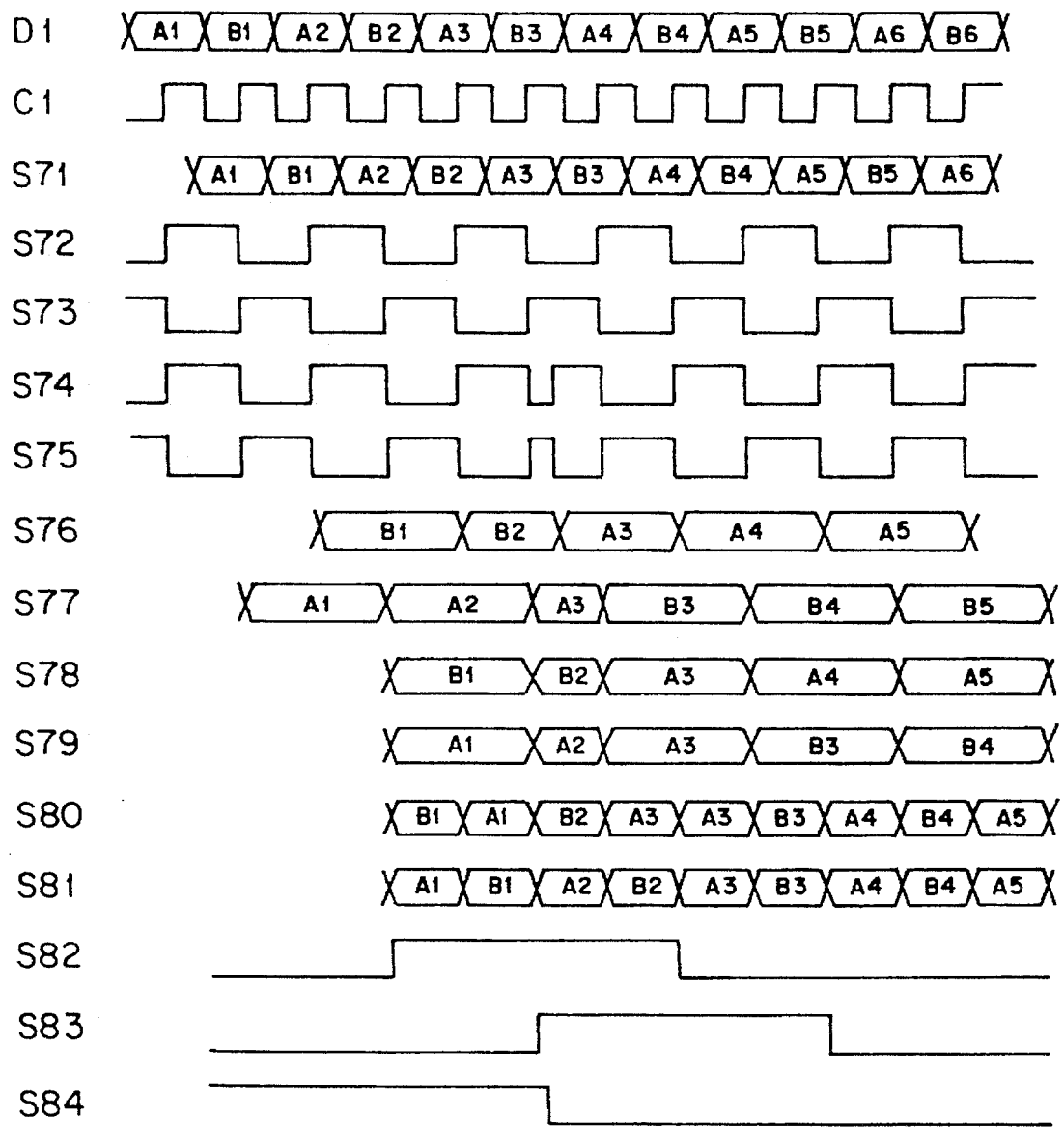
FIG. 12 is a timing chart used for explaining an operation of a serial/parallel converter circuit with an uncertainty removing function according to the fourth embodiment of the present invention.

The operation of the serial/parallel converter circuit with an uncertainty removing function according to the fourth embodiment of the present invention will be explained below with reference to the timing chart in FIG. 12.

That is, when the flip-flop 151 in the serial/parallel converter unit 60 receives input data D1 and an input clock C1, the input data D1 as serial signal (signal S71) shaped with the input clock C1 is outputted to the flip-flops 158 and 159 and the flip-flop 155 in the delay unit 55 via the delay unit 165.

The flip-flop 152 inputs the input clock C1 and outputs two kinds of clock signals (signals S72 and S73) similar to those from the flip-flops 72 and 122 in the first and third embodiments.

The flip-flops 158 and 159 receives the signal S71. The flip-flop 158 outputs the time slot B1 (signal S76) in response to the signal S74 as a clock selected by the selector 60a.

The flip-flop 159 outputs the time slot A1 (signal S77) in response to the signal S75 as a clock selected by the selector 60a. The signals S74 and S75 form a parallel signal.

The flip-flop 158 outputs the time slot (signal) B1 to the flip-flop 160 (in the phase adjusting unit 57) to adjust the phase of the signal S78. The flip-flop 159 outputs the time slot (signal) A1 to the flip-flop 161 (in the phase adjusting unit 57) to adjust the phase of the signal S79.

The selector 153 (parallel/serial converter unit 52) converts into a serial signal (signal S80) the parallel signals being formed of the time slot B1 from the flip-flop 160 and the time slot A1 from the flip-flop 161.

The exclusive OR circuit 154 (comparing and judging unit 53) receives the signal S80 from the selector 153 together with the signal S81 formed by the delay unit 55 formed of flip-flops 155 and 157 where the serial signal (signal S71) as an input signal is delayed by a predetermined time.

In this case, the result from the comparing and judging unit 53 indicates that the signals 80 and 81 have different time slots. Therefore, since the parallel signals converted by the serial/parallel converter unit 60 has not been obtained at a correct timing, the selector 60a outputs a control signal (signal S84) for inverting the clock selection.

The selector 60a in the serial/parallel converter unit 60 receives the control signal to invert the clock signals (signals S72 and S73) from the flip-flop 152, thus outputting the inverted signals as signals S74 and S75.

According to the time slots B2 and B3 following the time slot B, the signals S74 and S75 allow the serial/parallel converter unit 60, the phase adjusting unit and the parallel/serial converter unit 52 to output signal S76, signal S77 and the signal S80, respectively.

Similarly, the time slots A2 and A3 following the time slot A1 cause the signals S77, S79, and S80.

When the comparing and judging unit 53 compares the output from the parallel/serial converter unit 52 with the delayed serial signal (signal S81), the same slot is obtained in the time slot A3.

Therefore since the parallel signals are one converted at a predetermined timing by the serial/parallel converter unit 60, the selector 60a selects a clock so as to allow basically the output of the control signal (signal S84).

In the similar manner, the time slots B4 and A4 are sequentially converted into parallel signals at a predetermined timing (signals S78 and S79).

According to the present invention, in the communications system, for example, including cable communication sections together with radio communication sections and including a radio communication section relaying information between cable communication sections, a serial signal obtained through a parallel/serial conversion is transmitted in a radio communication section and then the parallel signals again subjected to a serial/parallel conversion are transmitted in a cable communication section. In this case, the present embodiment has advantages in that an uncertainty can be removed without depending on the line quality of the radio communication section and a serial/parallel conversion can be performed instantaneously and certainly signal bits in a desired arrangement, whereby conversion accuracy and conversion rate can be improved.

Furthermore, there is an advantage in that when a cable section is transferred to a radio section, it is not necessary to insert an insert bit to the serial signal subjected to a parallel/serial conversion so that communications can be performed with less information amount.

(f) Others:

According to the serial/parallel converter circuit with an uncertainty removing function according to the first to fourth embodiments, it is apparent that a serial signal with a specific bit pattern such as all "o" s or "1" s can be subjected to a serial/parallel conversion without any problem.

The communications system including cable communication sections and radio communication sections has been explained in the first to fourth embodiments. However, it should be noted that the present invention can be applied for a communications system including a cable section handling a large number of signal sections and a cable section handling a small number of signal sections.

What is claimed is:

1. A serial/parallel converter unit with an uncertainty removing function, comprising:

a serial/parallel convertor unit for converting an original serial signal which has been formed from an original parallel signal, into a new parallel signal;

a parallel/serial converter unit receiving said new parallel signal output by said serial/parallel converter unit, for converting said parallel signal into a new serial signal;

a comparing and judging unit receiving said original serial signal and receiving said new serial signal, for judging whether said serial/parallel converter unit has converted said serial signal into said parallel signals at a correct timing operation by comparing said new serial signal output from said parallel/serial converter unit with said original serial signal which has also been inputted to said serial/parallel converter unit; and a correcting unit for correcting the parallel signals from said serial/parallel converter unit when said comparing and judging unit determines that said new serial output is not identical to said original serial output, when said serial/parallel converter unit has not converted at a correct timing operation corresponding to a correct ordering of bits in said new serial output.

2. A serial/parallel converter circuit with an uncertainty removing function according to claim 1, further comprising a delay unit connected to the input of said comparing and judging unit for delaying the serial signal inputted to said serial/parallel converter unit by a predetermined time to adjust a timing at which the serial signal inputted to said serial/parallel converter unit is compared with the serial signal from said parallel/serial converter unit.

3. A serial/parallel converter circuit with an uncertainty removing function according to claim 1, further comprising a delay unit connected to the input of said correcting unit for delaying parallel signals from said serial/parallel converter unit by a predetermined time to adjust a timing at which the parallel signals from said serial/parallel converter unit is corrected.

4. A serial/parallel converter circuit with an uncertainty removing function according to claim 1, further comprising a phase adjusting unit connected to the input of said parallel/serial converter unit for adjusting the phase of each of parallel signals from said serial/parallel converter unit.

5. A serial/parallel converter unit with an uncertainty removing function comprising:

a first serial/parallel convertor unit for converting an original serial signal which has been formed from an original parallel signal, into a new parallel signal at a first timing;

a second serial/parallel convertor unit for converting said original serial signal which has been formed from an original parallel signal, into a new parallel signal at a second timing;

a parallel/serial converter unit receiving said parallel signal outputs by both said first serial/parallel converter unit and said second serial/parallel convertor unit, for converting said parallel signal from said first serial/parallel converter unit or from said second serial/parallel convertor unit into a new serial signal;

a comparing and judging unit receiving said original serial signal and receiving said new serial signal, for comparing said serial signal from said parallel/serial converter unit with said original serial signal inputted to both said first serial/parallel converter unit and said second serial/parallel convertor unit, and for then judging whether the respective one of said first serial/parallel converter unit and said second serial/parallel convertor unit has converted said original serial signal correctly into parallel signals at a correct timing operation by comparing said new serial signal output from said parallel/serial converter unit with said original serial signal; and a selecting unit for selecting the parallel signals from a corresponding one of said first and second serial/parallel converter units when conversion performed by either said first serial/parallel converter unit or said second serial/parallel convertor unit has been made at said correct timing, and for selecting parallel signals from the remaining one of said first and second serial/parallel converter units when said comparing and judging unit determines that said new serial output is not identical to said original serial output when said first serial/parallel converter unit or said second serial/parallel convertor unit has not performed conversion at said correct timing corresponding to a correct ordering of bits in said new serial output.

6. A serial/parallel converter circuit with an uncertainty removing function according to claim 5, further comprising a delay unit connected to the input of said comparing and judging unit for delaying a serial signal inputted to both said first serial/parallel converter unit and said second serial/parallel converter unit by a predetermined time to adjust a timing at which the serial signal inputted to both said first serial/parallel converter unit and said second serial/parallel converter unit is compared with a serial signal from said parallel/serial converter unit.

7. A serial/parallel converter circuit with an uncertainty removing function according to claim 5, further comprising a first delay unit connected to an input of said selecting unit for delaying each of parallel signals from said first serial/parallel converter unit by a predetermined time; and a second delay unit connected to an input of said selecting unit for delaying parallel signals from said second serial/parallel converter unit by a predetermined time.

8. A serial/parallel converter circuit with an uncertainty removing function according to claim 5, further comprising a phase adjusting unit connected to the input of said parallel/serial converter unit for adjusting the phase of each of parallel signals from either said first serial/parallel converter unit or said second serial/parallel converter unit.

9. A serial/parallel converter unit with an uncertainty removing function according to claim 8, further comprising a phase adjusting unit connected to the output of said first serial/parallel converter unit and said second serial/parallel converter unit, for adjusting a phase of each of the parallel signals output by said first serial/parallel converter unit and by said second serial/parallel convertor unit.

10. A serial/parallel converter unit with an uncertainty removing function, comprising:

a serial/parallel convertor unit for converting an original serial signal which has been formed from an original parallel signal according to an input clock timing into a new parallel signal;

a parallel/serial converter unit receiving said new parallel signal output by said serial/parallel converter unit, for converting said parallel signal into a new serial signal;

a comparing and judging unit receiving said original serial signal and receiving said new serial signal, for comparing said new serial signal from said parallel/serial converter unit with said original serial signal supplied to said serial/parallel converter unit, and for judging whether said serial/parallel converter unit has converted said original serial signal into said parallel signals at a correct timing operation by comparing said new serial signal output from said parallel/serial converter unit with said original serial signal which has also been inputted to said serial/parallel converter unit; and a control unit for controlling so as to invert the input clock timing of the clock timing inverter unit in said serial/parallel converter unit when said comparing and judging unit determines that said new serial output is not identical to said original serial output, when said serial/parallel converter unit has not converted at a correct timing operation corresponding to a correct ordering of bits in said new serial output.

11. A serial/parallel converter circuit with an uncertainty removing function according to claim 10, further comprising a delay unit connected to the input of said comparing and judging unit for delaying a serial signal inputted to said serial/parallel converter unit by a predetermined timing to adjust a timing at which said serial signal inputted to said serial/parallel converter unit is compared with a serial signal from said parallel/serial converter unit.

12. A serial/parallel converter circuit with an uncertainty removing function according to claim 10, further comprising a phase adjusting unit connected to the input of said parallel/serial converter unit for adjusting the phase of each of parallel signals from said serial/parallel converter unit.

* * * * *